United States Patent [19]

Baker

[11] Patent Number: 5,239,179
[45] Date of Patent: Aug. 24, 1993

[54] INFRARED DETECTOR DEVICES

[75] Inventor: Ian M. Baker, Romsey, United Kingdom

[73] Assignee: U.S. Philips Corp., New York, N.Y.

[21] Appl. No.: 764,665

[22] Filed: Sep. 24, 1991

[30] Foreign Application Priority Data

Oct. 17, 1990 [GB] United Kingdom ............... 9022464

[51] Int. Cl.$^5$ ........................................ H01L 31/0232
[52] U.S. Cl. ............................. 250/338.4; 250/339; 250/353
[58] Field of Search ............... 250/338.4, 338.1, 339, 250/353

[56] References Cited

U.S. PATENT DOCUMENTS

| 4,555,720 | 11/1985 | Readhead | 357/30 |
| 4,625,389 | 12/1986 | Readhead | 29/572 |
| 4,754,139 | 6/1988 | Ennulat et al. | 250/332 |

FOREIGN PATENT DOCUMENTS

| 2132757 | 7/1984 | United Kingdom . |
| 2164492 | 3/1986 | United Kingdom . |
| 2206447 | 1/1989 | United Kingdom . |

OTHER PUBLICATIONS

"Applied Optics and Optical Engineering" vol. II, Edited by R. Kingslake pp. 352-355 (1965).

Primary Examiner—Paul M. Dzierzynski
Assistant Examiner—Richard Hanig
Attorney, Agent, or Firm—William L. Botjer

[57] ABSTRACT

In an infrared detector device for viewing an object or scene at more than one wavelength, the detector elements (10 and 20) are optimized to have appropriately different infrared responses by being formed in accordance with the invention in different levels (1 and 2) of different material on a substrate (3). Infrared concentrators (55) such as immersion lenses, light-pipes and/or reflectors collect incident radiation (50) over an area larger than the active portion of the associated detector element (10 and/or 20) and concentrate the radiation (50) onto the active portions. The arrangement adopted in accordance with the invention provides adequate space for at least one connection (15) of each upper-level detector element (10) to extend to the substrate (3) through an area of the lower level (2) which is located between the lower-level active portions on which the radiation (50) is concentrated by the associated concentrators (55). This upper-level connection (15) may extend via an island (28) separated from the active portions (22,23) of the lower level (2) by a gap (40), or it may extend on a side-wall of the lower-level detector element (20) when this side-wall is insulated or separated by a p-n junction from the active portions of the detector element (20). The different-response elements (10 and 20) may be arranged one above the other or one between the others when viewed in plan view.

10 Claims, 4 Drawing Sheets

INFRARED DETECTOR DEVICES

BACKGROUND OF THE INVENTION

This invention relates to plural-wavelength infrared detector devices comprising groups of detector elements formed in two or more levels on a substrate, the detector elements of one level having a different infrared response from those of the other level(s). The detector elements may be photoconductive or photovoltaic and may be formed in, for example, cadmium mercury telluride. More information about the wavelength characteristics of an object or a scene can be obtained by viewing it using such a plural-wavelength infrared detector device so that for example, such a device can permit the temperature of a radiation source to be measured independent of the emissivity of the source and the transmission of the intervening space.

Infrared detector elements whose material (for example a specific composition of cadmium mercury telluride) is optimized for detecting radiation upto one cut-off wavelength (for example 11 micrometers) may be used to detect radiation upto a lower wavelength (for example 5 or 8 micrometers), and so it is possible to form all the detector elements of some plural-wavelength detector devices from a single layer of the same material and to filter or otherwise separate the wavelengths incident on the detector elements. However, a more efficient plural-wavelength detector device is obtained using two or more different materials optimized to have different wavelength responses for the detector elements. This is most readily achieved by providing the different materials as different levels on a substrate.

Published European patent application EP-A-0 087 842 which corresponds to U.S. Pat. Nos. 4,555,720 and 4,625,389 discloses such a plural-wavelength infrared detector device comprising a group of infrared detector elements formed in a lower level of material on a substrate, and a group of upper-level detector elements mounted on the lower level and having an infrared response different from the lower-level detector elements. Electrical connections are provided from the detector elements to the substrate. The detector elements may be photoconductive or photovoltaic. The substrate may be, for example an insulating support carrying conductor tracks, or the substrate may be, for example, a silicon integrated circuit for processing output signals from the detector elements. The whole contents of EP-A-0 087 842 are hereby incorporated herein as reference material.

The invention disclosed in EP-A-0 087 842 permits the electrical connections of each upper-level detector element to extend to the substrate via a portion (hereinafter termed "upper-connection portion") of the lower-level infrared-sensitive material. In the form disclosed in EP-A-0 087 842, the upper-connection portion of the lower level is separated from the lower-level detector elements by a gap, and this gap is bridged by the upper-level detector elements. This provides a simple yet reliable manner of providing connections to the upper level without degrading the performance of the detector elements in each level.

In the specific embodiment illustratd in the drawings of EP-A-0 087 842, a linear array of detector elements are formed in each level; in this case the upper-connection portions and the lower-level detector-element connections are located around the periphery of the lower level. Especially in the case of a 2-dimensional array of detector elements in each level, it may be desirable to locate at least some of the connections at areas inbetween the detector elements. However, the provision of connections to detector elements in two or more levels can occupy a considerable space between the detector elements which reduces the area available for detecting the infrared radiation in the active portions of each level. This problem is particularly acute for a plural-wavelength detector device having large numbers of detector elements in a 2-dimensional array in each level.

SUMMARY OF THE INVENTION

According to the present invention, there is provided a plural-wavelength infrared detector device comprising a group of infrared detector elements formed in a lower level of material on a substrate, a group of upper-level detector elements mounted on the lower level and having an infrared response different from the lower-level elements, and a group of infrared concentrators associated with the elements in such an arrangement that each concentrator serves to collect infrared radiation over an area larger than an active portion of the associated element and to concentrate the collected radiation onto the active portion of that element, each upper-level elements having at least one electrical connection which extends to the substrate through an area of the lower level which is located between the lower-level active portions on which the infrared radiation is concentrated by the associated concentrators.

By using in this manner two or more levels of material and infrared concentrators in conjunction with the upper-level connections, only small active areas are needed for detector of the infrared radiation concentrated in these areas, and there is adequate space between to accommodate the plural-level connections to the detector elements (including, if desired, upper-connection portions in the lower level).

Various forms of infrared concentrator may be used, including combinations of forms. Thus, for example the concentrators may be reflectors and/or lenses and/or light-pipes. It should be noted that it is already known to associate such concentrators with single infrared detector elements or with a single level of infrared detector elements. By way of example in this context, reference may be made to the following publications the whole contents of which are hereby incorporated as reference material:

published United Kingdom patent applications GB-A-2 206 447, GB-A-2 132 757 and GB-A-2 164 492;

pages 352 to 355 of the book "Applied Optics and Optical Engineering", vol. II published by Academic Press 1965, edited by R. Kingslake, and section 9 of the Infrared Handbook, edited by W. L. Wolfe and G. J. Zisis, and published in 1978 for and by the Office of Naval Research, Arlington, Va., U.S.A.

The lower-level detector elements may each be located below a respective upper-level detector element, and a respective concentrator may serve to concentrate the infrared on the active portions of both the upper-level element and the underlying lower-level element. However arrangements in accordance with the present invention are also possible in which, as seen in plan view at the surface of the substrate, the lower-level detector elements are located between the upper-level detector elements: in this case also, the upper-level connections may extend through the lower level at areas located between the lower-level detector elements.

The present invention also permits the electrical connections of the upper-level elements to extend to the substrate via a portion of the lower-level infrared-sensitive material. This upper-connection portion in the lower-level may be an insulated side-wall of a lower-level island, or it may be separated by a p-n junction from the lower-level detector elements. However, in accordance with the invention, the space gained from the use of the concentrators is adequate to provide upper-connection portions in the form of separate islands in the lower level, between the lower-level detector elements and divided from the active areas of the lower-level detector elements by a gap.

These and other features in accordance with the present invention will be illustrated further in embodiments of the invention now to be described, by way of example, with reference to the accompanying diagrammatic drawings, in which.

Figure 1:
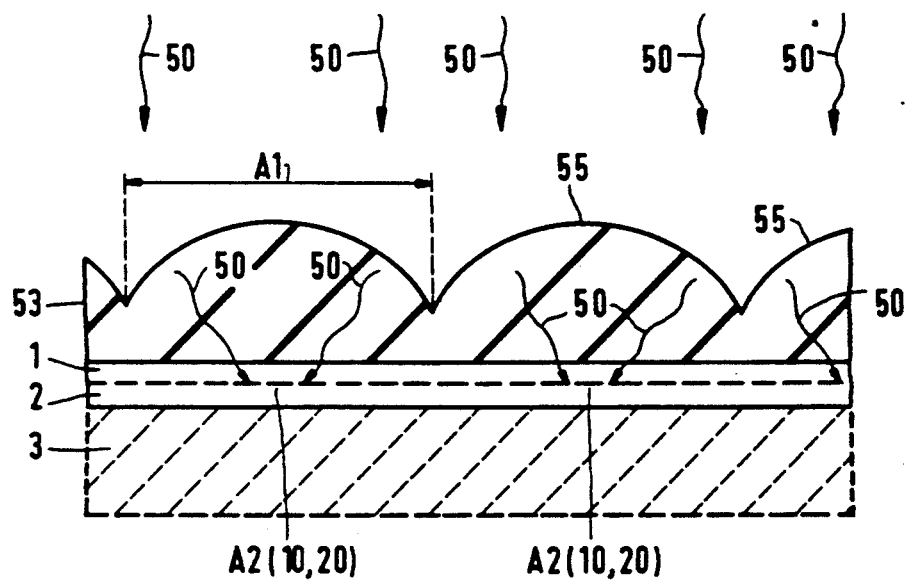
FIG. 1 is a schematic section of one type of plural-wavelength infrared detector device in accordance with the invention.

It should be noted that the Figures are diagrammatic and not drawn to scale. The relative dimensions and proportions of some parts of these drawings have been shown exaggerated or reduced in size for the sake of clarity and convenience in the drawings. The same reference signs as used in one embodiment are generally used when referring to corresponding to similar parts in other embodiments. In general, semiconductor regions of the same conductivity type are hatched in the same direction in the cross-sectional views.

DETAILED DESCRIPTION OF THE PRIOR ART

Figure 2:
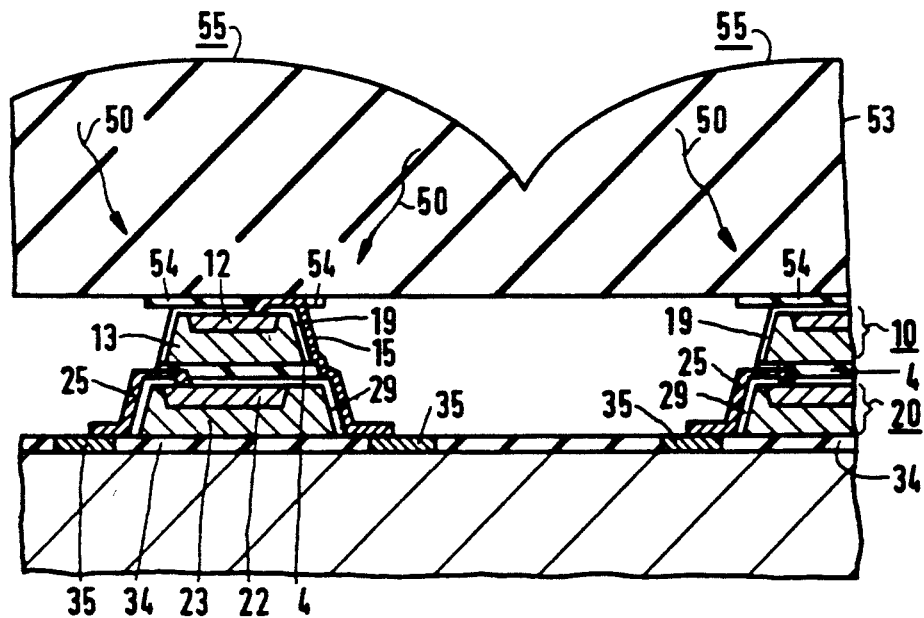
FIG. 2 is a cross-sectional view (on the line II—II of FIG. 3) of one specific example of the device of FIG. 1.
Figure 3:
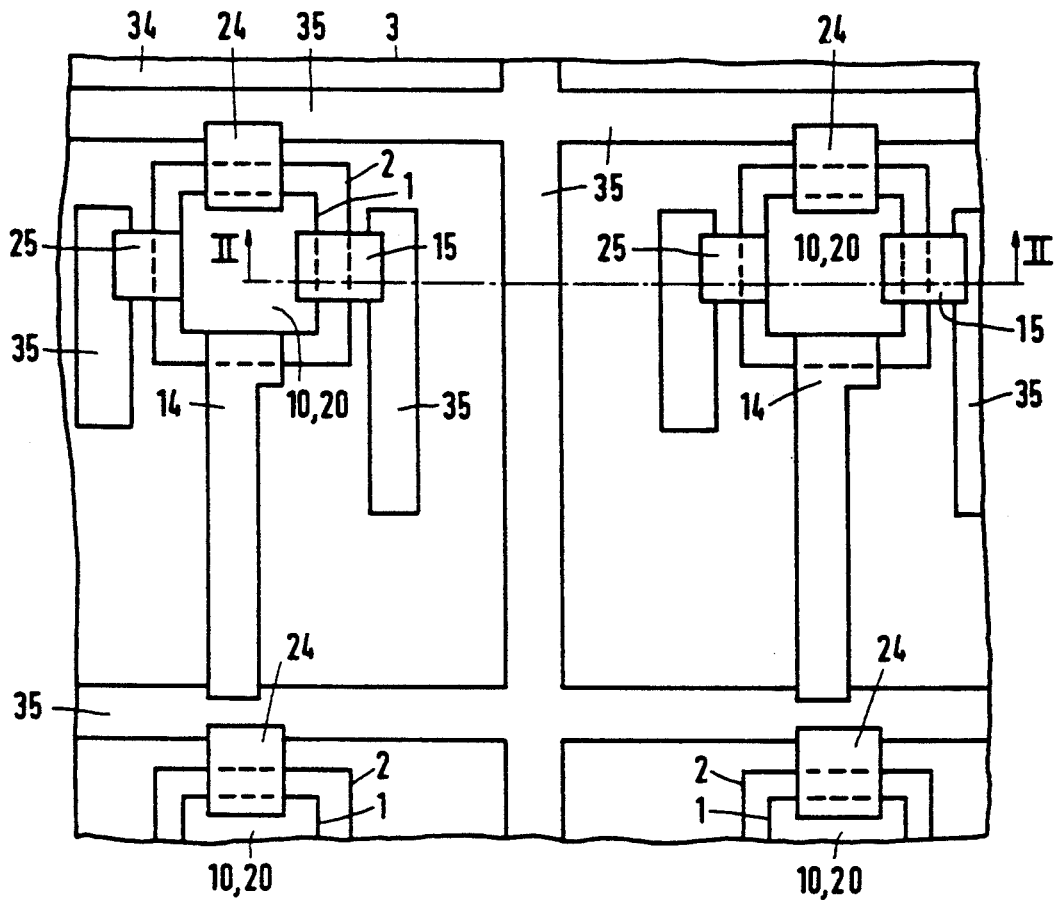
FIG. 3 is a plan view of the infrared detector elements on a substrate in the specific example of FIG. 2.

In accordance with the present invention, the device of FIG. 1 comprises more than one level 1 and 2 of infrared-sensitive semiconductor material on a surface of a substrate 3 or 53. These levels 1 and 2 may be at least partly insulated from each other by an intermediate insulating layer 4, see FIGS. 2 and 4. A group of infrared detector elements 10 and 20 if formed in each level 1 and 2 respectively. Each detector element 10 and 20 may be a photodiode, specific examples of which are illustrated in FIGS. 2 and 3 and in FIGS. 4 and 5 and in FIG. 6. Because a variety of different configurations may be used for these detector elements, the structure within each level and 1 and 2 is not indicated in FIG. 1. There are electrical connections 14, 15, 24 and 25 from the elements 10 and 20 to the substrate 3 or 53. The semiconductor materials of the levels 1 and 2 have different energy bandgaps so as to provide different wavelength responses. Thus, in the particular examples of FIGS. 2 and 3 and of FIGS. 4 and 5, the lower-level material 2 on the substrate 3 has a smaller bandgap than the upper-level material 1 so that the photodiodes 20 have a response to a longer wavelength than the photodiodes 10. Although FIGS. 1 to 5 show only two levels 1 and 2 for the sake of simplicity in the illustration of the embodiments, it should be understood that three or more levels may be present. Thus, a plural-wavelength infrared detector device in accordance with the invention may comprise detector elements having two, three or more different wavelength response characteristics.

In accordance with the present invention, a group 53 of concentrators 55 is associated with the detector elements 10 and 20 in such an arrangement that each concentrator 55 serves to collect incident infrared radiation 50 over an area A1 larger than an active portion A2 of the associated element (either 10 or 20, or both 10 and 20) and to concentrate the collected radiation 50 onto the active portion A2 of that detector element. Furthermore, as illustrated in different specific forms of FIGS. 2 and 3 and FIGS. 4 and 5, at least one electrical connection 15 of each upper-level detector element (10 in the case of FIGS. 2 to 5 with the substrate 3) extends to the substrate through an area of the lower level (2 in the case of FIGS. 2 to 5) which is located between the lower-level active portions A2 in which the radiation 50 is concentrated by the associated concentrators 55.

The concentrators 55 may be formed as infrared transmissive segments of a slab or plate in front of the detector elements 10 and 20. In the type of device structure illustrated in FIG. 1, each concentrator 55 is a lens formed in a segmented plate 53 of infrared transmissive material. The rear surface of such a plate 53 may be suitable for the mounting of the detector elements 10 and 20, in which case the substrate to which the connections extend may be the concentrator plate 53, so that level 1 is the lower detector-element level, and level 2 is the upper detector-element level with the larger bandgap and shorter-wavelength response; in this case no additional substrate member 3 is provided, and this is indicated by the broken outline of member 3 in FIG. 1. However, in many device configurations it is more convenient to provide the member 3 as the substrate on which the detector elements 10 and 20 are mounted and to which their connections extend.

The substrate 3 or 53 may be an insulating support carrying a pattern of conductor tracks 35 having non-insulated areas contacted by the detector-element connections. However, especially in the case of arrays of large numbers of detector elements 10 and 20, the substrate preferably comprises a signal multiplexing and/or processing circuit and so may be formed as, for example, a silicon integrated circuit. This circuit may have contact areas 35 at windows in an uppermost insulating layer 34 and is more readily compatible with being fabricated in the substrate 3 as a separate member from the concentrators 55. This configuration will be described in the specific examples of FIGS. 2 and 3 and FIGS. 4 and 5, having the detector elements 10 and 20 between the substrate 3 and the concentrators 55.

Figure 4:
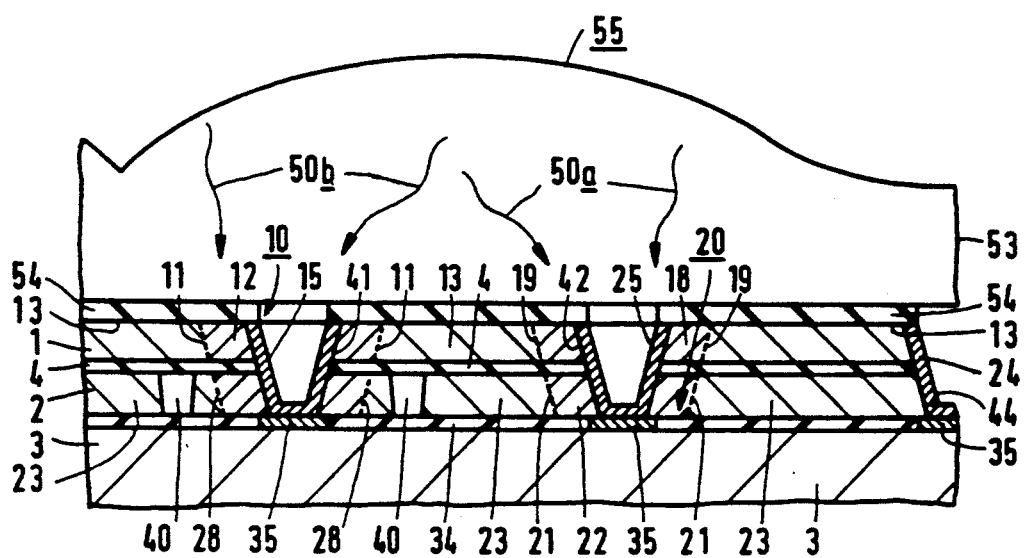
FIG. 4 is a cross-sectional view (on the line IV—IV of FIG. 5) of another specific example of the device of FIG. 1.
Figure 5:
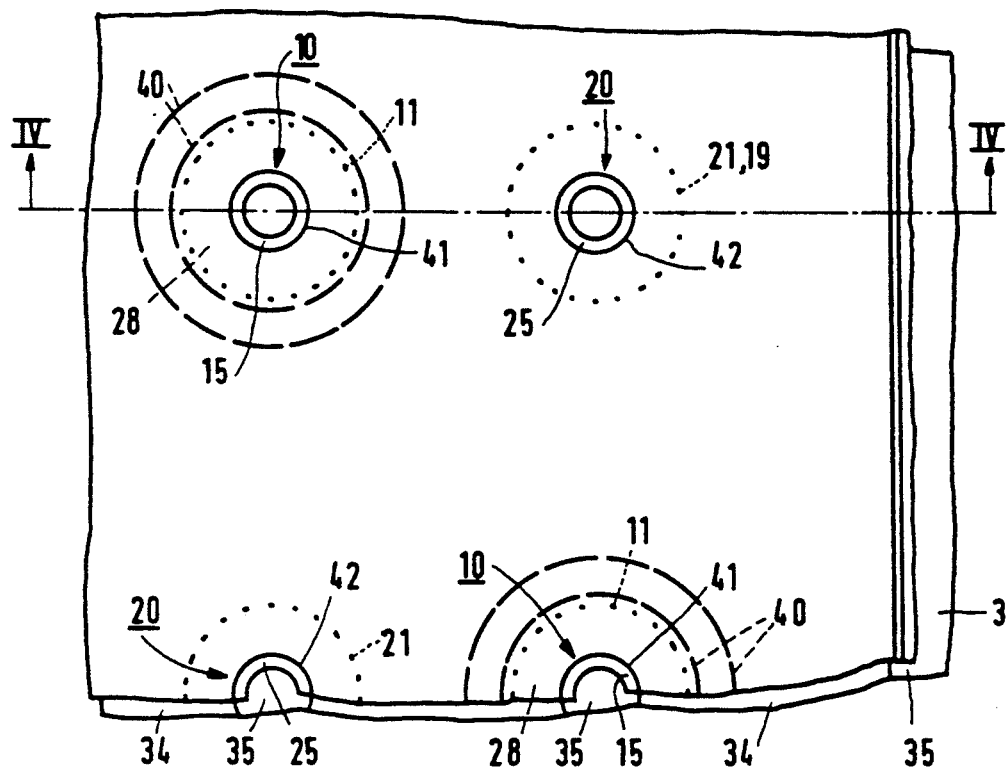
FIG. 5 is a plan view of the infrared detector elements on the substrate in the device of FIG. 4.

In the specific example of FIGS. 2 and 3, each detector element 10 and 20 comprises a separate island of the infrared-sensitive material, for example, p type cadmium mercury telluride. The lower islands 20 may be bonded to the substrate 3 by a film of epoxy adhesive. The upper-level islands 10 are carried on these lower-level islands 20, and both may be bonded together by a film of, for example epoxy adhesive. These epoxy films may form at least part of the insulating layers 4 and 34. Preferably the surface of the cadmium mercury telluride material 1 and 2 is passivated, for example with a surface layer of cadmium telluride or zinc sulphide, except where the detector-element regions are electrically contacted by their connections. The upper surface of the upper-level detector elements may be bonded to the concentrator plate 53 by a very thin film 54 of epoxy adhesive. The epoxy may also fill the space between the neighboring islands on the substrate 3, or this space may be left empty. Preferably each concentrator 55 is coupled sufficiently intimately to the front side of its associated detector element 10 as to provide optical immersion for the detector element. In the device structure of FIGS. 2 and 3, each lens 55 concentrates the infrared 50 onto the active portions of both the upper-level detector element 10 and the underlying lower-level detector element 20. FIGS. 4 and 5 illustrate a different situation in which each lens 55 concentrates different-wavelength radiation 50b or 50a onto either an upper-level detector element 10 or a lower-level detector element 20.

The lens plate 53 may be of, for example, cadmium telluride, germanium or silicon with an anti-reflective coating on its surfaces. The arrangement of each immersion lens 55 in relation to its infrared detector element 10 and/or 20 may be optimized in accordance with various criteria so as to provide adequate optical performance with very small active portions of the detector elements and adequate space for the connections. Pages 352 to 355 of the book "Applied Optics and Optical Engineering", edited by R. Kingslake describe three forms of immersion lens for an individual infrared detector element. These are a concentric form in which the detector element 10 is located at the center of curvature of the lens, an aplanatic form (also called hyper-hemispheric) in which the detector element is a distance r/n behind the center of curvature (where r is the radius of curvature and n is the refractive index), and an immersion field-lens form in which this lens is positioned just in front of the primary focal plane so as to image the primary aperture onto the detector element. All three forms may be used in the design of the lens elements 55 in the segmented lens plate 53 of FIG. 1 for the optical immersion of the small active portions of detector elements in devices in accordance with the present invention.

In the concentric form, the image size is reduced linearly by the refractive index of the lens, and the image area is reduced by the square of the refractive index. In the aplanatic form the image size can be reduced linearly by the square of the refractive index, and the area by the fourth power of the index, but this imposes other restrictions in terms of the acceptance angle (F number) of the primary optic. A greater freedom for optical design may be achieved with the immersion field-lens form. Thus, for example, by using a germanium lens plate 53 with detector elements 10, the area A1 of each of the germanium lens 55 (refractive index=4) as measured parallel to the substrate 3 may be sixteen or more times the area A2 of the front face of the respective detector element 10 and/or 20 in the array without significant loss of optical area. This permits the use of very small dimensions for the active portion of the cadmium mercury telluride detector element bodies 10 and 20 so that there is adequate space inbetween to accommodate the plural-level connections. In the case of a lens 55 made of cadmium telluride (refractive index=2.5), this lens area A1 may be 6.25 or more times that of the detector element area A2.

In the specific structure of FIGS. 2 and 3, the detector elements 10 and 20 are photodiodes having n type regions 12 and 22 formed in individual p type islands 13 and 23, and each photodiode 10 and 20 has individual connections 14 and 15, and 24 and 25. The side walls of these islands 13 and 23 (as well as a part of the top surface) are insulated by the cadmium telluride or zinc sulphide passivation layer 19 and 29. Connection 24 contacts the p type bulk of the lower-level island 23 via a window in the passivation layer 29 at the top surface and/or side-wall of the island 23. Connection 25 contacts the n type region 22 via a window at the top surface where it extends as an insulated track on the passivation layer over the p-n junction and then extends to the substrate 3 over the insulated side-wall of the island 23. Connection 14 contacts the p type bulk of the upper-level island 13 via a window in the passivation layer 19 at the top surface and/or side-wall of the island 13. Connection 15 contacts the n type region 12 via a window at the top surface where it extends as an insulated track on the passivation layer over the p-n junction and then extends over the insulated side-wall of the upper-level island 13. Both upper connections 14 and 15 extend to the substrate conductors 35 on the insulated side-walls of the lower-level island 23. Because of the arrangement of the concentrators 55, there is adequate space for all these connections 14,15,24, and 25 to the substrate conductors 35 in between the active portion A2 of the detector elements 10 and 20.

Many modifications of this connection arrangement are possible. Thus, for example, the separate connection 14 may be omitted, and the connection 24 may extend as a common connection on p type side walls of both islands 13 and 23. Furthermore, the connection 15 may extend on an n type side-wall (instead of an insulated side-wall) of island 13, and the connection 25 may extend on an n type side-wall (instead of an insulated side-wall) of island 23; these n type side walls may merge with the respective n type surface regions 12 and 22. Furthermore, instead of the upper-level connection 15 extending on an insulated side-wall of the lower-level detector element 20, there is adequate space to provide in the lower level 2 a separate island portion, separated by a gap from the detector element 20. Thus, in accordance with the invention in EP-A-0 087 842, the upper-level element 10 may bridge this gap and its connection 15 may be carried to the substrate 3 on this separate island portion in the lower level 2.

FIGS. 4 and 5 illustrate a different specific example of the FIG. 1 type of a plural-wavelength infrared detector device in accordance with the invention. In addition to benefiting from its construction in accordance with the present invention, this particular device also benefits from utilizing the inventions disclosed in published European Patent Application EP-A-0 061 803 (as can be seen especially from FIG. 5) and EP-A-0 087 842 (as can be seen especially from FIG. 4) and co-pending United Kingdom patent application GB 90.19897.9 (our reference PHB33666). The whole contents of EP-A-0 061 803, EP-A-0 087 842 and GB 90.19897.9 are hereby incorporated herein as reference material. These inventions may also be used in modifications of the device of FIGS. 2 and 3.

Figure 6:
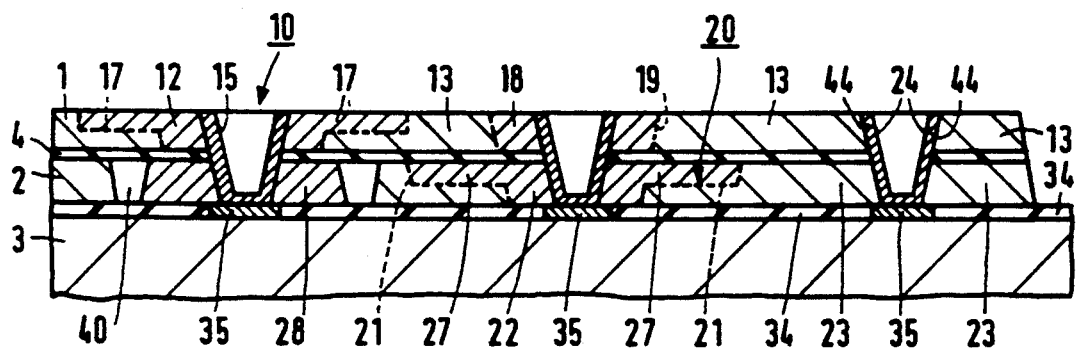
FIG. 6 is a cross-sectional view similar to that of FIG. 4 but incorporating various modifications in accordance with the invention.

In this particular embodiment of the present invention in FIGS. 4 and 5 and also in accordance with the invention disclosed in EP-A-0.061 803, the connection 15 to the active region 12 of the upper-level photodiode 10 comprises an island 28 of the lower-level material 2 which is separated by a gap 40 from the region 23 of the lower-level photodiode 20. The gap 40 is annular in this embodiment, so that the region 23 surrounds the island 28. The upper photodiode 10 bridges this gap 40. In the particular form illustrated in FIGS. 4 and 5, the connection 15 comprises metallization carried on the side-wall 41 of an aperture through the island 28, and the island 28 includes a p-n junction which surrounds the aperture and which may be formed in the same processing steps as the p-n junctions 11 and/or 21 of the photodiodes 10 and 20 respectively. However, such a p-n junction need not be present in the island 28; thus, the island 28 may be wholly one conductivity type, for example n type formed simultaneously with n type regions 12 and/or 22, the gap 40 being located where any resulting p-n junction might otherwise be formed. This variant is illustrated in FIG. 6. Although exposed to the incident infrared radiation 50, the separate island 28 has only the one connection 15 and so does not contribute to the output signal of the shorter-wavelength photodiode 10 as measured by the silicon circuit 3.

In this specific device of FIGS. 4 and 5, the electrical connection 25 between the substrate 3 and one region 22 of the longer-wavelength response photodiode 20 extends on an uninsulated side-wall 42 of the semiconductor materials of both the upper and lower levels 1 and 2. The larger-bandgap material in level 1 comprises a further region 18 which adjoins the side-wall 42 and which forms in the level 1 a further p-n junction 19 electrically in parallel with the photodiode p-n junction 21 in level 2. This further p-n junction 19 in the larger-bandgap material has a higher impedance than the photodiode junction 21 in the smaller-bandgap material 2, and so the output signal in connection 25 is dominated by the photocurrent generated at the photodiode junction 21 in accordance with the invention disclosed in GB 90.19897.9. The difference in impedance is due primarily to the different values in bandgap between the levels 1 and 2, because the impedance varies with the exponential of the bandgap. This permits the connection 25 of the lower-level photodiode 20 to be formed (through both levels 1 and 2) at the same time and in the same processing steps as the connection 15 of the upper-level photodiode 10. However, in a modified form, the connection 25 may be formed before mounting the upper-level material 1; thus in this modification the connection 25 is restricted to the lower-level 2 and is bridged by the overlying material 1 which comprises the photodiode 10 without the inclusion of any further region 18 and without any further p-n junction 19.

The other region 23 of the longer-wavelength response photodiode 20 has its electrical connection 25 on another uninsulated side-wall 44 of the semiconductor materials of both the levels 1 and 2, and this connection 24 also contacts one region 13 of the shorter-wavelength response photodiode 10 so as to provide a common connection for both photodiodes 10 and 20.

In the device structure of FIGS. 4 and 5 and utilizing also the invention disclosed in EP-A-0 061 803, the side-wall connections 15 and 25 are formed as metallization on an uninsulated side-wall 41 and 42 respectively of an aperture passing locally through the thickness of both levels 1 and 2. The aperture wall 42 is surrounded by region 2 of the longer-wavelength photodiode 20 in the level 2 and by the further region 18 in the level 1. The aperture wall 41 is surrounded by the region 12 of the shorter-wavelength photodiode 10 in the level 1 and by the island 28 in the level 2. The common connection 24 may be formed by metallization on a side-wall 44 at the periphery of the plural-level structure 1 and 2 (as is illustrated by way of example in FIGS. 4 and 5) or on a side-wall 44 of one or more local apertures as illustrated in FIG. 6.

It should be noted that, in the device of FIGS. 4 and 5, the photodiode junctions 11 and 21 extend only around the apertures 41 and 42 respectively. Thus, the active portion A2 of the detector element 10 is located around the apertures 41, and the active portion A2 of the detector elements 20 is located around the apertures 42. Consequently, as seen in plan view at the surface of the substrate 3, the lower-level detector elements 20 are located between the upper-level detector elements 10. In FIGS. 2 and 3, each lens 55 concentrates all the radiation 50 on both an upper-level detector element 10 and an underlying lower-level detector element 20. However, the embodiment of FIGS. 4 and 5 with the illustrates embodiment of the lens 55 is used in a plural-wavelength system in which the different wavelengths to be detected are directed at different angles towards the lenses 55 so that each lens 55 concentrates the longer wavelength 50a onto an associated lower-level longer-wavelength photodiode 20 while also concentrating the shorter wavelength 50b onto the associated upper-level shorter-wavelength photodiode 10 in between the photodiodes 20. Such a plural-wavelength imaging system may employ the lenses 55 in proximity with, for example, a diffraction grating to form a diffractive color filter in a manner similar to the disclosed in U.S. Pat. No. 4,225,019, the whole contents of which are hereby incorporated herein as reference material. U.S. Pat. No. 4,255,019 teaches the use of a single photosensitive surface at the focal plane of the lens array; whereas the arrangement of FIGS. 4 and 5 is modified by comparison so that, in accordance with the present invention, the different wavelengths 50b and 50a are concentrated by the lenses onto infrared detector elements 10 and 20 which are formed in different levels 1 and 2 of different materials optimized to have the desired different wavelength responses and which have their connections 15,24 and 25 extending to the substrate from the different levels 1 and 2 in the manner already described.

In FIGS. 4 and 5 this structure and arrangement of the connections 15,24 and 25 of the detector elements 10 and 20 facilitates the fabrication of the two-level detector-element structure on an integrated circuit substrate 3 and permits the achievement of reliable, high performance photodiodes 10 and 20 in large 2-dimensional arrays at each level 1 and 2. Although the connection structure occupies more space than the connection structure of FIGS. 2 and 3, there is adequate space for these connections inbetween the active portions A2 of the detector elements 10 and 20 due to the use of the lenses 55 as infrared concentrators in accordance with the invention.

However, the plural-level structure of the detector elements 10 and 20 of FIGS. 4 and 5 may be incorporated in arrangements in which the elements 10 and 20 do not share a lens 55 as illustrated in FIG. 4. Thus, each element 10 or 20 may have its own individual lens or other concentrator 55 associated exclusively with that element. Appropriate filters may also be incorporated or the filtering action of the infrared-sensitive materials 1 and 2 themselves may be used. In this case, each lens 55 concentrates the radiation 50 on either an upper-level detector element 10 or a lower-level detector element 20 but not on both elements 10 and 20. Therefore with this modification, neighboring pixels in a scene are now detected at different wavelengths corresponding to the different responses of the detector elements 10 and 20.

Modifications of the device of FIGS. 4 and 5 are possible in which at least a major part of the photovoltaic junction extends parallel to the major surface. FIG. 6 illustrates one such a situation in which the p-n junctions 27 and 17 are provided as lateral extensions from the vertical p-n junctions 21 and 11 respectively. These junctions 27 can be formed by n type surface regions provided at the surface of the p type body 2 before mounting the body 1, and the junctions 17 can be formed by n type surface regions provided in the body 1 before ion-etching the apertures 41 and 42. The lateral extension of the n type surface regions may be such that the junctions 17 and 27 do not significantly overlap but their boundaries may substantially coincide as seen in the plan view at the surface of the circuit substrate 3; in this case, the detector elements 10 in level 1 are still located between the detector elements 20 in level 2, as seen in this plan view.

Depending on the requirements imposed by the system in which the device is used, a modification of the geometry of FIG. 6 is possible in which from one side of the apertures 41 and 42 the junctions 17 and 27 may extend so far as to overlap, as seen in plan view at the substrate 3. Thus, a major part of the active area A2 of photodiode 20 now underlies a major part of the active area A2 of photodiode 10. In this case the associated lens 55 may concentrate the radiation 50 onto the area of overlap of these active n type regions between the two apertures 41 and 42.

In the embodiments illustrated in FIGS. 1 to 6, the infrared concentrators 55 are shown in the form of immersion lenses. However other infrared concentrators may be used in front of the arrays of plural-level detector elements 10 and 20 in accordance with the present invention. Thus instead of lenses, trapezoidal elements are described as concentrators in GB-A-2 164 492. Furthermore, as described in Section 9 of the Infrared Handbook, edited by W. L. Wolfe and G. J. Zisis, light-pipes and cone channel condensers may be provided in front of detector elements, instead of immersion lenses. Such light-pipes may be constructed as, for example, a cone or a pyramid and can be made as a hollow reflector or a solid rod.

Figure 7:
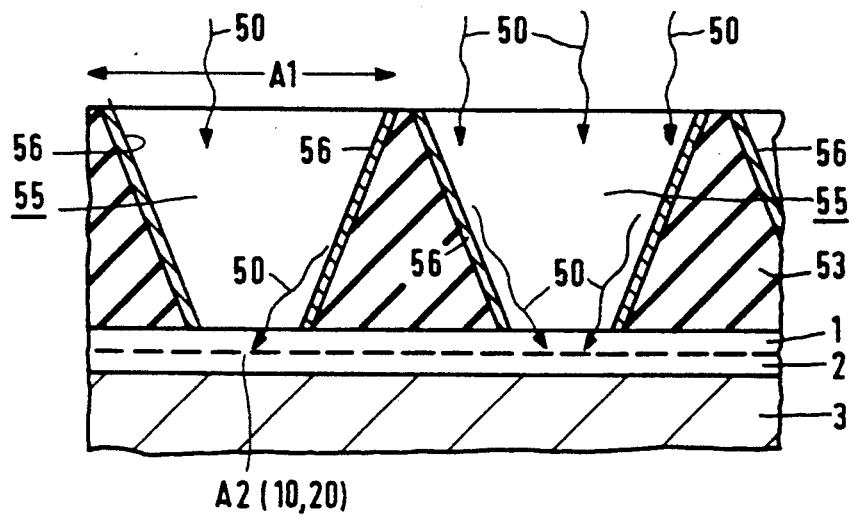
FIG. 7 is a schematic section of another type of plural-wavelength infrared detector device in accordance with the invention.

FIG. 7 illustrates the use of one such form with an array in accordance with the invention. In this form, the concentrators 55 are hollow reflectors formed as a reflective metal coating 56 on the inside of tapered holes in a plate 53. The plate 53 may be mounted on the plural-level detector element structures illustrated in FIGS. 2 to 6. In the case of the detector-element island structures of FIGS. 2 and 3, the plate 53 may be carried on separate inactive islands inbetween the detector-between islands 13 and 23.

However, instead of hollow reflectors 55, the plate 53 may comprise an array of solid light-pipes 55 each of which may be, for example, a tapered optical fiber, the fibers being embedded in suitable material to form the plate 53. In this case, it is particularly advantageous for the front end of the optical fibers to be domed, for example, to present a lens-like front to the incident light 30. The plural-level detector-element structure 10 and 20 can be optically immersed at the rear end of the fibers. The front end of each fiber 55 has an area A1 (measured parallel to the major face of the substrate 3) which is larger than the area A2 of the active portion of the associated detector element 10 and/or 20.

Figure 8:
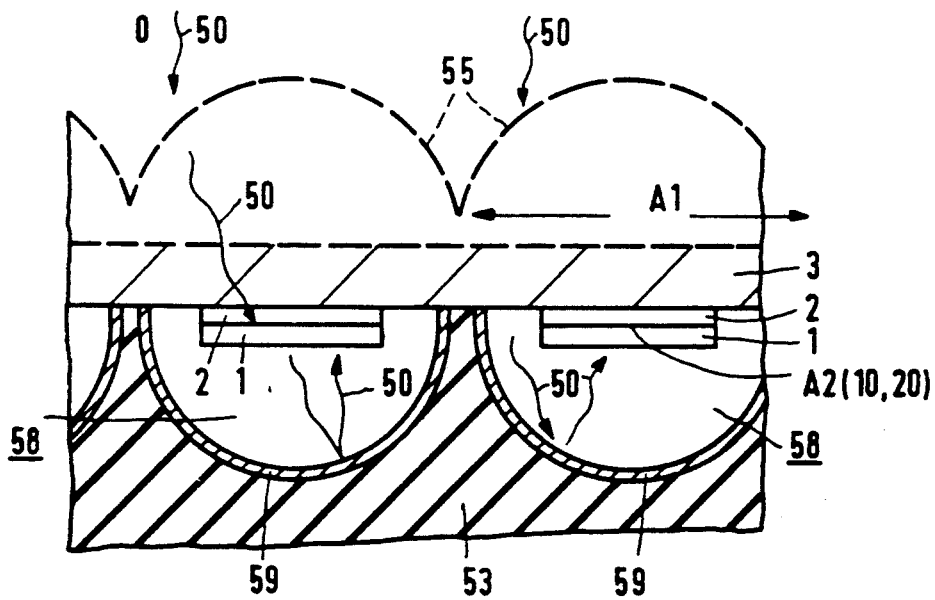
FIG. 8 is a schematic section of a further type of plural-wavelength infrared detector device in accordance with the invention.

In the devices so far described, the array of concentrators 55 (for example, light-pipes or lenses) is present in front of the detector elements 10 and 20. FIG. 8 illustrates a further arrangement where each of the concentrators comprises a reflector cavity 58 behind the detector elements 10 and 20. Each detector element 10 and/or 20 is mounted in or adjacent the front of its associated reflector cavity 58. The cavities 58 may be formed by etching into a substrate 53 at an array of windows in a masking layer, and then depositing a metal reflective layer 59 as a coating in the etched cavities. As illustrated by the broken outline in FIG. 8, an infrared-concentrator may also be included in a substrate 3 mounted on the front of the cavities plate 53. The detector elements 10 and 20 are carried by the substrate 3 which may be segmented to form either lenses or light-pipes corresponding to the array of detector elements 10 and 20. However, a simpler structure is also possible (but optically less advantageous) in which the substrate 3 does not incorporate infrared concentrators. In the FIG. 8 situation where the substrate 3 faces the incident radiation 50, the shorter-wavelength detector element having the larger bandgap may be present in the lower level 2 on the connection substrate 3, and the upper level 1 then comprises the longer-wavelength detector element having the smaller bandgap. If the connection structure of FIGS. 4 and 5 is used in this case, the further region 18 with p-n junction 19 is formed in the lower level 2, and either the isolating gap 40 and island 28 is formed in the upper level 1 or this area of the upper level 1 is totally removed.

Thus, various types and arrangements of infrared concentrators may be used in a plural-wavelength infrared detector device in accordance with the invention. Summarising, in more general terms:

the group of infrared concentrators may be present in front of the detector elements to concentrate the incident radiation onto the active areas of the elements;

each infrared concentrator may be coupled sufficiently intimately to the front side of its associated detector element so as to provide optical immersion for the detector element;

the infrared concentrators may comprise infrared-transmissive segments of a segmented plate in front of the detector elements;

each concentrator may comprise a lens or a light-pipe or another form of optical element;

each infrared concentrator may comprise a reflector cavity in which or adjacent the front of which its associated detector element is mounted; this reflector cavity may be included instead of or in addition to infrared concentrators in front of the detector elements.

It will be evident that many other modifications are possible within the scope of the invention. Although the side-wall connections 14, 15, 24 and 25 described in these embodiments are formed by metallization, at least some of the electrical connections in some device structures in accordance with the invention may be formed either wholly or partly by highly-doped regions of the semiconductor material in each level, for example by n type regions adjacent the side-walls for connections 15 and 25.

Although embodiments have been described in which the cadmium mercury telluride levels 1 and 2 have been bonded together and to the substrate 3 by an epoxy adhesive, a plural-level structure may alternatively be grown by deposition, for example using vapor phase epitaxy of cadmium mercury telluride on the substrate 3. Thus, for example, after growing a cadmium telluride layer on the circuit substrate, the gas flow may be switched to grow a lower level 2 of cadmium mercury telluride, then an insulating layer 4 of cadmium telluride, then an upper level 1 of cadmium mercury telluride of different bandgap and then an upper cadmium telluride layer for passivation or even for formation (in later steps) of the plate 53 of the concentrators 55.

Although high performance detectors for the 3 to 5 $\mu$m and 8 to 14 $\mu$m wavebands can be obtained with cadmium mercury telluride, other materials may alternatively be used for detector elements in at least one level 1 or 2. Thus, for example, level 1 and/or level 2 may be of another ternary intermetallic chalcogenide such as lead tin telluride. Binary semiconductor compounds such as for example leas sulphide or indium antimonide may be used. Even single-element materials such as silicon or germanium may be chosen for a short-wavelength infrared detector element. The material and/or composition of the two levels 1 and 2 is chosen form such materials so that the different bandgaps give their desired different wavelength responses for the different detector elements 10 and 20. Thus, for example, the different detector elements 10 and 20 may respond to infrared-wavelengths in different atmospheric windows, 1 to 2 $\mu$m, 3 to 5 $\mu$m, 8 to 14 $\mu$m, and 16 to 22 $\mu$m, or even to different wavelength ranges in the same atmospheric window.

From reading the present disclosure, other modifications and variations will be apparent to persons skilled in the art. Such variations may involve equivalents and other features which are already known in the design, manufacture and use of infrared detector devices, systems and component parts thereof, and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalization thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

I claim:

1. A plural-wavelength infrared detector device comprising a group of infrared detector elements formed in a lower level of material on a substrate, a group of upper-level detector elements mounted on the lower level and having an infrared response different from the lower-level elements, and a group of infrared concentrators associated with the elements in such an arrangement that each concentrator serves to collect incident infrared radiation over an area larger than an active portion of the associated element and to concentrate the collected radiation onto the active portion of that element, each upper-level element having at least one electrical connection which extends to the substrate through an area of the lower level which is located between the lower-level active portions on which the infrared radiation is concentrated by the associated concentrators.

2. A detector device as claimed in claim 1, characterized in that the lower-level elements are each located below a respective upper-level element, and in that a respective concentrator serves to concentrate the infrared on the active portions of both the upper-level element and the underlying lower-level element.

3. A detector device as claimed in claim 2, characterized in that each element comprises a separate island of infrared-sensitive material, and in that the upper-level islands are carried on the lower-level islands.

4. A detector device as claimed in claim 1, characterized in that, as seen in plan view at the surface of the substrate, the lower-level elements are located between the upper-level elements.

5. A detector device as claimed in any one of claims 1 further characterized in that each group of the elements is formed in a layer of a respective infrared-sensitive material, the upper-level layer being carried on the lower-level layer.

6. A detector device as claimed in claim 1, characterized in that both the upper-level and lower-level elements each have a p-n junction in infrared-sensitive semiconductor material, the material of one level having a smaller bandgap than the other.

7. A detector device as claimed in claim 6, characterized in that one of the electrical connections of each upper-level element extends to the substrate on a further regions of the lower-level semiconductor material, which further region is separated by a p-n junction from the detector-element p-n junction in the lower-level.

8. A detector device as claimed in claim 1, characterized in that at least one connection of each upper-level element extends to the substrate on an insulated side-wall of a portion of the lower-level material.

9. A detector device as claimed in claim 1, characterized in that, for each upper-level element, there is provided a separate island of the lower-level infrared sensitive material which is located between lower-level detector elements and via which at least one connection of each upper-level element extends to the substrate.

10. A detector device as claimed in claim 1, characterized in that the group of infrared concentrators is present in front of the elements to concentrate the incident radiation onto the active areas of the elements.

* * * * *